(12) United States Patent
Maheshwari

(10) Patent No.: US 7,417,882 B1
(45) Date of Patent: Aug. 26, 2008

(54) CONTENT ADDRESSABLE MEMORY DEVICE

(75) Inventor: Dinesh Maheshwari, Fremont, CA (US)

(73) Assignee: Netlogics Microsystems, Inc., Mountain View, CA (US)

( * ) Notice: Subject to any disclaimer, the term of this patent is extended or adjusted under 35 U.S.C. 154(b) by 13 days.

(21) Appl. No.: 11/525,274

(22) Filed: Sep. 21, 2006

Related U.S. Application Data

(60) Provisional application No. 60/719,415, filed on Sep. 21, 2005.

(51) Int. Cl.
*G11C 15/00* (2006.01)
*G11C 7/06* (2006.01)
*G11C 8/00* (2006.01)

(52) U.S. Cl. ............... 365/49; 365/189.07; 365/230.03

(58) Field of Classification Search ............ 365/49, 365/189.07, 230.03
See application file for complete search history.

(56) References Cited

U.S. PATENT DOCUMENTS

| | | | |
|---|---|---|---|
| 4,523,301 A | 6/1985 | Kadota et al. | |
| 4,646,271 A | 2/1987 | Uchiyama et al. | |
| 4,845,668 A | 7/1989 | Sano et al. | |
| 5,339,268 A | 8/1994 | Machida | |
| 5,949,696 A * | 9/1999 | Threewitt | 365/49 |
| 6,078,513 A * | 6/2000 | Ong et al. | 365/49 |
| 6,094,368 A * | 7/2000 | Ching | 365/49 |
| 6,108,227 A | 8/2000 | Voelkel | |
| 6,128,207 A * | 10/2000 | Lien et al. | 365/49 |
| 6,157,558 A * | 12/2000 | Wong | 365/49 |
| 6,266,262 B1 | 7/2001 | Washburn et al. | |
| 6,374,326 B1 * | 4/2002 | Kansal et al. | 365/49 |
| 6,480,406 B1 * | 11/2002 | Jin et al. | 365/49 |
| 6,505,270 B1 * | 1/2003 | Voelkel et al. | 365/49 |
| 6,515,884 B1 * | 2/2003 | Sywyk et al. | 365/49 |
| 6,564,289 B2 | 5/2003 | Srinivasan et al. | |
| 6,757,779 B1 * | 6/2004 | Nataraj et al. | 365/49 |
| 6,775,167 B1 * | 8/2004 | Avramescu et al. | 365/49 |
| 6,906,936 B1 * | 6/2005 | James et al. | 365/49 |
| 6,910,097 B1 * | 6/2005 | Srinivasan et al. | 365/49 |
| 7,019,999 B1 * | 3/2006 | Srinivasan et al. | 365/49 |
| 7,050,318 B1 * | 5/2006 | Argyres | 365/49 |
| 7,054,993 B1 * | 5/2006 | Srinivasan et al. | 365/49 |
| 7,171,595 B1 * | 1/2007 | Huse et al. | 365/49 |
| 7,193,877 B1 * | 3/2007 | Yelluru | 365/49 |
| 7,213,101 B1 * | 5/2007 | Srinivasan et al. | 365/49 |
| 7,219,187 B1 * | 5/2007 | Khanna et al. | 365/49 |
| 7,228,378 B1 * | 6/2007 | Pereira | 365/49 |
| 7,233,512 B2 * | 6/2007 | Lysinger et al. | 365/49 |
| 7,237,156 B1 * | 6/2007 | Srinivasan et al. | 365/49 |
| 7,251,707 B1 * | 7/2007 | Pereira | 365/49 |

\* cited by examiner

*Primary Examiner*—Trong Phan
(74) *Attorney, Agent, or Firm*—Haverstock & Owens, LLP

(57) ABSTRACT

A content addressable memory (CAM) device can include a plurality CAM cell groups. The CAM cells of each group can be commonly connected to at least one local compare data line. A mask value circuit can be provided corresponding to each CAM cell group. Each mask value circuit can provide a mask value. At least a first logic circuit corresponding to each CAM cell group can have a first input coupled to at least a first global compare data line, a second input coupled to receive the mask value of the corresponding mask value circuit, and an output coupled to the corresponding at least first local compare data line.

20 Claims, 5 Drawing Sheets

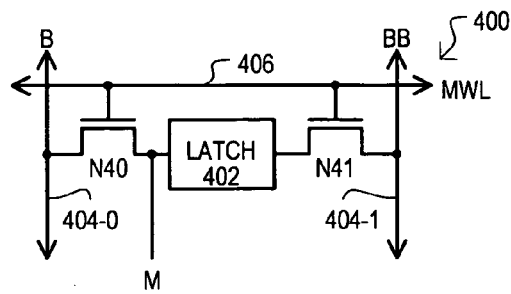
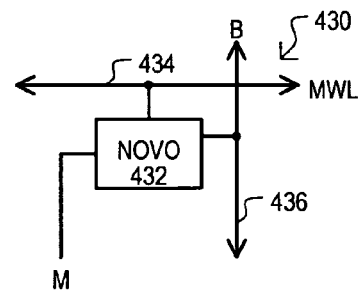
FIG. 4A         FIG. 4B
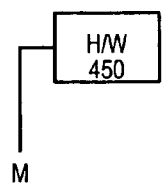
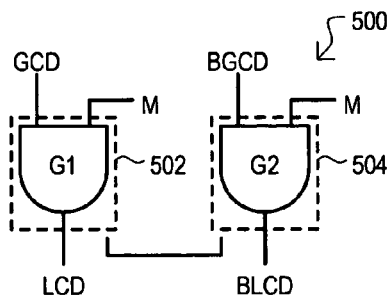
FIG. 4C         FIG. 5
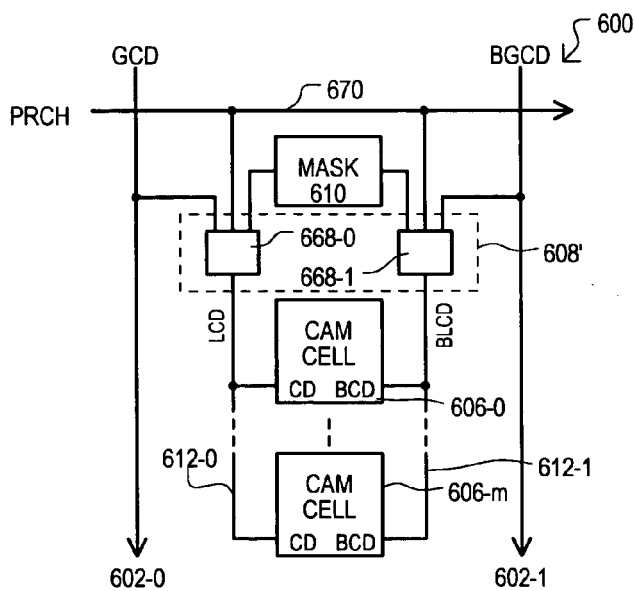
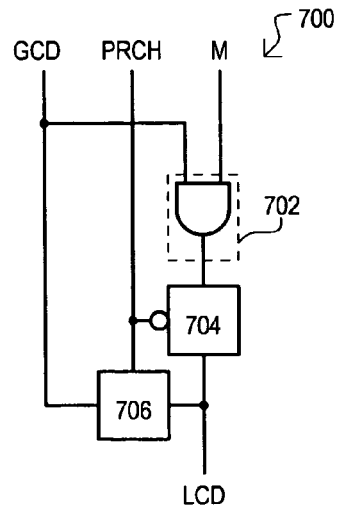
FIG. 6         FIG. 7

CONTENT ADDRESSABLE MEMORY DEVICE

This application claims the benefit of U.S. Provisional Patent Application Ser. No. 60/719,415, filed Sep. 21, 2005, the contents of which are incorporated by reference herein.

TECHNICAL FIELD

The present invention relates generally to memory devices, and more particularly to content addressable memory (CAM) devices.

BACKGROUND OF THE INVENTION

Content addressable memory (CAM) devices are widely used in networking and communications applications. A content addressable memory is one where the contents of the memory are searched by a 'key', which relates to the content of each memory location, rather than by an address, as in a conventional memory device.

Conventional CAM devices can include binary CAM devices and ternary CAM (TCAM) devices. Binary CAM devices can provide a match result based on a bit-by-bit comparison between bits of a compare data value and a stored data value. Full TCAM devices can enable a bit-by-bit masking of compare results for each data value. "Pseudo" TCAM (PTCAM) devices can provide masking on a multiple bitwise basis. In particular, matching can be masked on a columnwise basis, with a same bit location within multiple stored data values being masked from a compare operation.

A conventional PTCAM device will now be described with reference to FIG. 12. Conventional PTCAM 1200 includes CAM cells 1202-0 and 1202-1 arranged in a first column, and CAM cells 1202-2 and 1202-3 arranged into a second column. CAM cells (1202-0 and 1202-1) of a first column can receive a first complementary compare data values CD0/BCD0 by way of compare data lines 1204-0 and 1204-1. In the same way, CAM cells (1202-2 and 1202-3) of a second column can receive a second complementary compare data values CD1/BCD1 by way of compare data lines 1204-2 and 1204-3.

In a row direction, CAM cells 1202-0 and 1202-2 can be commonly connected to one match line 1206-0, while CAM cells 1202-1 and 1202-3 can be commonly connected to another match line 1206-1.

In the conventional PTCAM 1200, each column can have a corresponding mask value storage circuit 1208-0 and 1208-1. A mask value storage circuit (1208-0 and 1208-1) can provide a mask value (M0/M1) to CAM cells of the corresponding column.

Referring still to FIG. 12, in the conventional arrangement each CAM cell (1202-0 to 1202-3) can include a storage circuit 1210 and a compare circuit 1212. Each compare circuit 1212 can include six transistors N0 to N5. Transistors N0-N2 and N3-N5 can have source-drain paths arranged in series between a match line (1206-0 or 1206-1) and a low power supply Vss. Transistors N0/N3 can receive complementary compare data values CD0/BCD0 or CD1/BCD1 at their respective gates. Transistors N1/N4 can receive the same mask value M0/M1 for the column at their respective gates. Transistors N2/N5 can receive complementary stored data values V/BV, at their respective gates.

In such a conventional arrangement, a mask value M0/M1 can dictate a match result for the corresponding column. More particularly, if a mask value M0/M1 is low, CAM cells of the corresponding column will not be capable of forming a discharge path for their corresponding match lines, as transistors N1 and N4 can be placed in a high impedance state. However, if a mask value M0/M1 is high, CAM cells of the corresponding column may or may not form a discharge path for their corresponding match lines depending upon a comparison between a stored data value V/BV and applied compare data value CD/BCD.

In this way, in a conventional TCAM, masking of bit compare operations can be performed on a columnwise basis according to a mask value for each column.

BRIEF DESCRIPTION OF THE DRAWINGS

FIGS. 4A to 4C are block schematic diagrams of mask storage circuits that can be included in the embodiments.

FIG. 5 is schematic diagram of one example of a local compare data driver circuit that can be included in disclosed embodiments.

FIG. 6 is a block schematic diagram of a CAM device according to a third embodiment.

FIG. 7 is a block schematic diagram of a driver/equalization circuit that can be included in disclosed embodiments.

DETAILED DESCRIPTION

Various embodiments of the present invention will now be described with reference to a number of drawings. The embodiments show content addressable memory (CAM) devices that can provide masking of multiple CAM cells according to a single mask value to form a pseudo ternary CAM (PTCAM) device, or a multi-level TCAM device. A multi-level TCAM device can provide masking on increasingly larger numbers of CAM cell groups.

Figure 1:
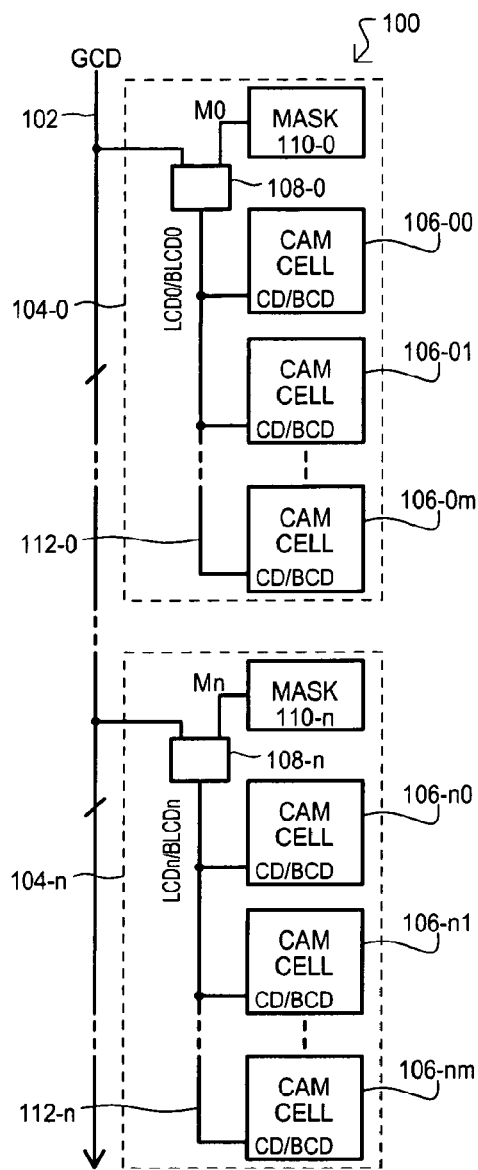
FIG. 1 is a block schematic diagram of a content addressable memory (CAM) device according to a first embodiment.

A CAM device according to a first embodiment is shown in FIG. 1 in a block schematic diagram, and designated by the general reference character 100. CAM device 100 can include a global compare data line 102 and a number of sections 104-0 and 104-n. It is understood that a global compare data line 102 can include a single conductive line for providing a global compare data value GCD, or alternatively, a pair of conductive lines for providing complementary global compare data values GCD/BGCD.

Referring still to FIG. 1, each section (104-0 and 104-n) can include a group of CAM cells, a local compare data driver circuit, and a mask value storage circuit. Each section can have the same general construction and operate in the same general fashion, thus only section 104-0 will now be described in detail.

It is understood that the arrangement in FIG. 1 can be repeated to form multiple columns of a CAM cell device.

Section 104-0 can include a group of CAM cells 106-00 to 106-0*m*, local compare data driver circuit 108-0, and mask value storage circuit 110-0. Each CAM cell of a group (106-00 to 106-0*m*) can provide a compare result based on a comparison between a stored data value and values received at a compare data inputs CD/BCD. CAM cells of the same group (106-00 to 106-0*m*) can receive compare data inputs CD/BCD from corresponding local compare data lines 112-0 of the section, and not a global compare data line 102.

Within each section, local compare data lines 112-0 can provide local compare data values LCD0/BLCD0 to the corresponding group of CAM cells (106-00 to 106-0*m*). Local compare data values LCD0/BLCD0 can be generated by the corresponding local compare data driver circuit 108-0 of the section 104-0. A local compare data driver circuit 108-0 can generate local compare data values LCD0/BLCD0 based in part, or entirely, upon a logical combination of a global compare data value GCD and a mask value M0 of the corresponding mask value storage circuit 110-0. As a result, during a compare operation, local compare data values LCD0/BLCD0 received by CAM cells of a group are not necessarily complementary values. This is in contrast to a conventional approach like that of FIG. 12, in which all CAM cells of a column can receive complementary compare data values.

Referring still to FIG. 1, In one particular approach, if a mask value (e.g., M0) has a first logic value, corresponding local compare data values (e.g., LCD0/BLCD0) can be forced to a same logic value, and thus mask a compare operation for all CAM cells of the group. In contrast, if such a mask value (e.g., M0) has a second logic value, corresponding local compare data values (e.g., LCD0/BLCD0) can be driven to complementary values that reflect a global compare data value. In this case, bitwise compare operations can compare such a global compare data value to a data value stored by each CAM cell.

In this way, groups of CAM cells can provide compare results based on a logical combination of a mask value specific to the CAM cell group, and a global compare data value common to all CAM cell groups.

Figure 2:
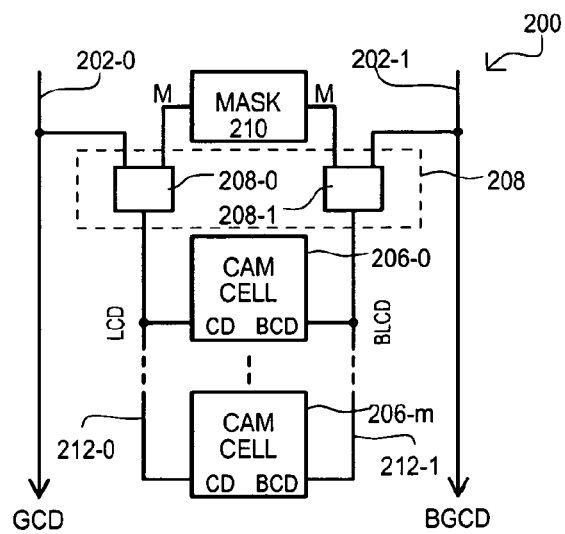
FIG. 2 is a block schematic diagram of a CAM device according to a second embodiment.

Referring now to FIG. 2, a CAM device according a second embodiment is shown in a block schematic diagram and designated by the general reference character 200. A CAM device 200 can include some of the same general features as that shown in FIG. 1, thus like portions will be referred to by the same reference character but with the first digit being a "2" instead of a "1,".

CAM device 200 can include multiple sections connected to a same global compare data line, as in FIG. 1. Thus, while FIG. 2 shows but one section, it is understood that multiple such sections can be included.

In FIG. 2, a global compare data line can include complementary compare data lines 202-0 and 202-1 that provide global compare data values GCD and BGCD. In a compare operation, global compare data values GCD/BGCD can be complementary values. However, it is noted that such values can be driven to a same level in other operations, such as precharge operations.

Referring still to FIG. 2, a local compare data driver circuit 208 can include a first driver circuit 208-0 and a second driver circuit 208-1. First driver circuit 208-0 can drive a local compare data value LCD0 on a local compare data line 212-0 based on a logical combination of a mask value M and a global compare data value GCD. Second driver circuit 208-1 can drive a complementary local compare data value BLCD0 on a complementary local compare data line 212-1 based on a logical combination of a mask value M and a complementary global compare data value BGCD.

In this way, a group of CAM cells can perform compare operations against local compare data values, where such local compare data values are generated by a logical combination of a global compare data value and a mask value specific to the CAM cells.

Figure 3A:
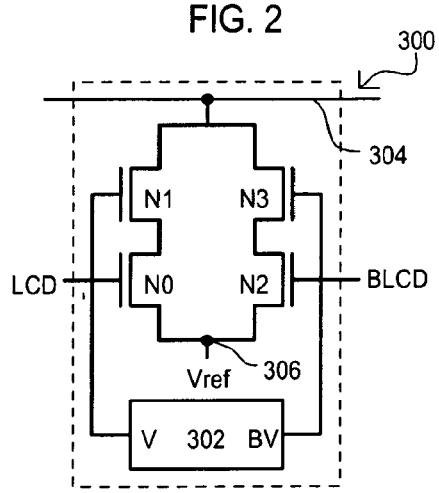
FIG. 3A is a block schematic diagram of one CAM cell that can be included in the various embodiments.

Referring now to FIG. 3A, one example of CAM cell that can be incorporated into the various embodiments is shown in block schematic diagram and designated by the general reference character 300. CAM cell 300 can include a storage circuit 302 and a compare circuit. A compare circuit can include n-channel insulated gate field effect transistors N0 to N3. A storage circuit 302 can provide stored data values V/BV. Stored data value BV can be the complement of stored data value V.

Transistors N0/N1 can have source-drain paths arranged in series with one another between a match line 304 and a reference node 306. In a similar fashion, transistors N2/N3 can have source-drain paths in series with one another between a match line 304 and a reference node 306. Transistor N0 can receive a local compare data value LCD at its gate, while transistor N2 can receive complementary local compare data value BLCD at its gate. Transistors N2 and N3 can receive complementary stored data values V and BV, respectively, at their gates.

Referring still to FIG. 3A, in the arrangement shown, when local compare data values LCD/BLCD are complementary values, CAM cell 300 can enable or disable a current path between match line 304 and reference node 306 according to whether the compare data value LCD/BLCD matches or does not match a stored data value V/BV. In contrast, when local compare data values LCD/BLCD are both low, CAM cell 300 will maintain a high impedance state between match line 304 and reference node 306 regardless of the stored data value V/BV.

Preferably, a match line 304 can be precharged to a high potential with respect to reference node 306 (Vref) prior to a compare operation. A reference node 306 can be a low power supply voltage or a "pseudo" supply voltage. A pseudo supply voltage node can be precharged to one level prior to a compare operation and then allowed to float during the compare operation.

It is noted that a CAM cell like that of FIG. 3A can include only two transistors in each discharge path of a compare circuit. This is in sharp contrast to the conventional case of FIG. 12, which includes three transistors in each discharge path. In this way, embodiments of the present invention can provide pseudo-ternary functions utilizing CAM cells with compare circuits that are two transistors "deep", and not three transistors deep. This can reduce compare data line size and/ or array size, increasing speed and/or decreasing power consumption over a conventional approach.

Figure 3B:
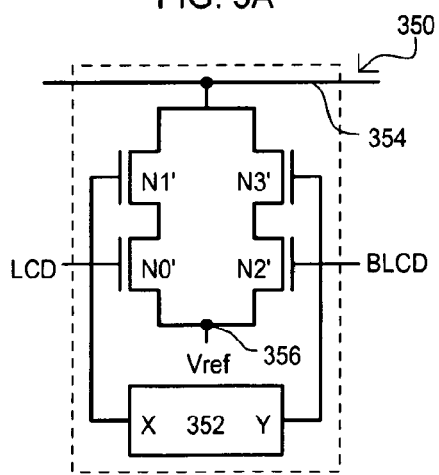
FIG. 3B is a block schematic diagram of another CAM cell that can be included in the various embodiments.

Referring now to FIG. 3B, another example of CAM cell that can be incorporated into the various embodiments is shown in block schematic diagram and designated by the general reference character 350. CAM cell 350 can include a storage circuit 352 and a compare circuit formed by n-channel insulated gate field effect transistors N0' to N3'.

CAM cell 350 can have the same general structure as CAM cell 300, however, a storage circuit 352 can be an XY type storage circuit. Unlike a V/BV storage circuit 302 of FIG. 3A, an XY type storage circuit 352 can provide stored data values XY that are not always complementary. In particular, values XY may be complementary (e.g., "01" or "10") to represent different stored data values. However, values XY may also be the same value (e.g., "00") to represent a masked bit.

Accordingly, when memory cells like that of FIG. 3B are incorporated in to the various embodiments, a resulting CAM device can be a multi-level TCAM. CAM cells may provide bitwise masking based on XY values, as well as group masking according to a group mask value M. More particularly, referring to FIG. 3B, when values XY are both low, CAM cell 350 will provide a high impedance path between match line 354 and reference node 356 (Vref), regardless of a local compare data values LCD/BLCD. Further, when local compare data values LCD/BLCD are both low, CAM cell 350 will provide a high impedance path between match line 354 and reference node 356, regardless of stored data values XY. However, when compare data values LCD/BLCD and stored data values XY values are complementary values, CAM cell 350 can enable or disable a current path between match line 354 and reference node 356 according to whether the compare data value LCD/BLCD matches or does not match a stored data value XY.

In this way, a CAM device according to an embodiment can provide multi level ternary matching functions.

The above embodiments have shown arrangements in which a mask storage circuit can provide a mask value for logical combination with a global compare data values. Such mask circuits can take both volatile and nonvolatile forms. A few of the many possible match value circuits will now be described with reference to FIGS. 4A to 4C.

Referring to FIG. 4A, a mask storage circuit is shown in a block schematic diagram and designated by the general reference character 400. A mask storage circuit 400 can include a volatile storage circuit into which a mask data value can be written. In the example shown, mask storage circuit includes a latch 402 into which data values can be written in a differential fashion by access transistors N40 and N41. In particular, a mask value can be driven in complementary form on bit lines 404-0 (B) and 404-1 (BB). A mask word line 406 (MWL) can then be driven high, allowing the mask value to be stored in latch 402. Of course, a mask storage circuit 400 could be single ended, being accessed via only one bit line. Further, bit lines 404-0 and 404-1 can be dedicated to writing mask values or have a dual function, also serving as global compare data lines.

Referring to FIG. 4B, another example of a mask storage circuit is shown in a block schematic diagram and designated by the general reference character 430. A mask storage circuit 430 can include a conventional nonvolatile (NOVO) memory cell 432 accessible by a mask word line (MWL) 434, and connected to receive write data by way of one or more bit lines 436 (B). Again, bit lines may or may not also carry global compare data values. A conventional nonvolatile memory cell 432 can include, without limitation, a read only memory (ROM) cell, such as a mask programmable ROM (PROM) cell, electrically PROM (EPROM) cell, electrically erasable PROM (EEPROM) cell, or a magneto-resistive random access memory (MRAM) cell.

Referring now to FIG. 4C yet another example of a mask storage circuit is shown in a block schematic diagram and designated by the general reference character 450. A mask storage circuit 450 can provide a mask value based on a hardware (H/W) option established by a manufacturing step for the CAM device. As but a few of the many possible examples, a mask value can be established by a mask option that forms or does not form a conductive path in one or more predetermined metallization layers. Alternatively, such a conductive path can be enabled or disabled according to a state of a fuse structure or antifuse structure.

As noted above, local compare data values LCD/BLCD can be generated by a local compare data driver circuit based on a logical combination of at least a mask value and global compare data value GCD. One example of such a circuit is shown in FIG. 5.

FIG. 5 shows a local compare data driver circuit in a schematic diagram, designated by the general reference character 500. Local compare data driver circuit 500 can include a first driver circuit 502 and a second driver circuit 504. A first driver circuit 502 can include an AND gate G1 having one input that receives a mask value M and another input that receives global compare data value GCD. An output of gate G1 can provide a local compare data value LCD. Similarly, second driver circuit 504 can include an AND gate G2 having one input that receives a mask value M and another input that receives a complementary global compare data value BGCD. An output of gate G2 can provide a complementary local compare data value BLCD.

Of course FIG. 5 represents but one example of a local compare data driver circuit. Various other logic circuits could be employed according to polarity of received global compare data values and a mask value. Further, a local compare data driver could include various output buffers to increase drive strength for local compare data lines.

Referring now to FIG. 6, a CAM device according to a third embodiment is shown in block schematic diagram and designated by the general reference character 600. CAM device 600 can include some of the same general features as that shown in FIG. 2, thus like portions will be referred to by the same reference character but with the first digit being a "6" instead of a "2".

CAM device 600 can differ from that of FIG. 2 in that a local compare data driver circuit 608' can include a first driver/equalization circuit 668-0 and a second driver/equalization circuit 668-1 in place of first and second driver circuits. Both first and second driver/equalization circuits (668-0 and 668-1) can receive a precharge signal PRCH by way of a precharge line 670. When a precharge signal PRCH is inactive, first and second driver/equalization circuits (668-0 and 668-1) can generate local compare data values LCD/BLCD in the same fashion as the embodiment of FIG. 2. However, unlike the embodiment of FIG. 2, when a precharge signal PRCH is active first driver equalization circuit 668-0 can provide a low impedance path between global compare data line 602-0 and local compare data line 612-0, and second driver equalization circuit 668-1 can provide a low impedance path between complementary global compare data line 602-1 and complementary local compare data line 612-1. This can enable charge sharing between such lines, which can reduce power consumption.

In this way, in a precharge operation preceding and/or succeeding a compare operation, global compare data lines can be equalized with corresponding local compare data lines.

Referring now to FIG. 7, one example of a driver/equalization circuit is shown in a block schematic diagram and designated by the general reference character 700. A driver/equalization circuit could be used as items 668-0 and/or 668-1 of FIG. 6. A driver/equalization circuit 700 can include a logic circuit 702, a first switch circuit 704, and a second switch circuit 706. A logic circuit 702 can logically combine a mask value with a global compare data value.

A first switch circuit 704 can provide a low impedance path when signal PRCH is inactive, and a high impedance path when signal PRCH is active. Second switch circuit 706 can operate in the opposite fashion as first switch circuit 704, providing a high impedance path when signal PRCH is inactive, and a low impedance path when signal PRCH is active.

While first and second switch circuits (704 and 706) could take various forms, such circuits could include complementary conductivity transistors or oppositely activated CMOS-type passgate circuits, as but two examples. Further, it may be desirable to activate such switch circuits with opposite edge delays. That is, when signal PRCH transitions from inactive to active, it may be desirable to disable first switch circuit 704 prior to enabling second switch circuit 706. When signal PRCH transitions from active to inactive, it may be desirable to disable second switch circuit 706 prior to enabling first switch circuit 704.

Figure 8:
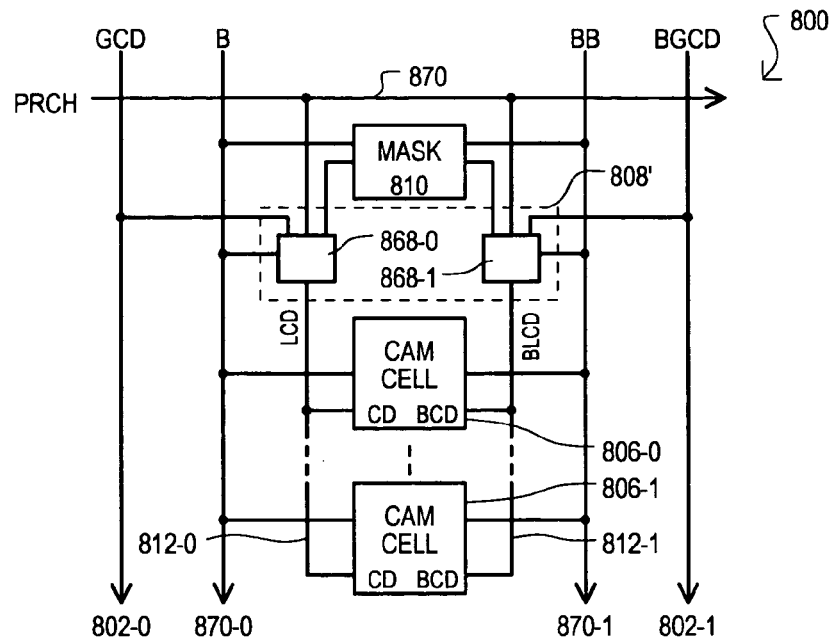
FIG. 8 is a block schematic diagram of a CAM device according to a fourth embodiment.

Referring now to FIG. 8 a CAM device according to a fourth embodiment is shown in block schematic diagram and designated by the general reference character 800. CAM device 800 can include some of the same general features as that shown in FIG. 6, thus like portions will be referred to by the same reference character but with the first digit being a "8" instead of a "6".

CAM device 800 can differ from that of FIG. 6 in that it can include bit lines 870-0 (B) and 870-1 (BB). Bit lines (870-0 and 870-1) can carry data for a write operation into a mask value storage circuit 810, or into CAM cells (806-0 to 806-m), or into both. In addition, a local compare data driver circuit 808' can include a first driver/equalization circuit 868-0 connected to a first bit line 870-0, and a second driver/equalization circuit 868-0 connected to a second bit line 870-1.

When a precharge signal PRCH is inactive, first and second driver/equalization circuits (868-0 and 868-1) can generate local compare data values LCD/BLCD in the same fashion as the embodiment of FIG. 2. However, when a precharge signal PRCH is active, first driver/equalization circuit 868-0 can provide a low impedance path between local compare data lines (e.g., 812-0) and at least a first bit line 870-0, and second driver equalization circuit 868-1 can provide a low impedance path between complementary local compare data lines (e.g., 812-1) and at least a second bit line 870-1.

In one variation of the embodiment of FIG. 8, in a precharge operation (signal PRCH active), only local compare data lines can be equalized with a first bit line, and only complementary local compare data lines can be equalized with a second bit line. However, in an alternate variation, a global compare data line and local compare data lines can be equalized with a first bit line, and a complementary global compare data line and complementary local compare data lines can be equalized with a second bit line.

Figures 9A, 9B:
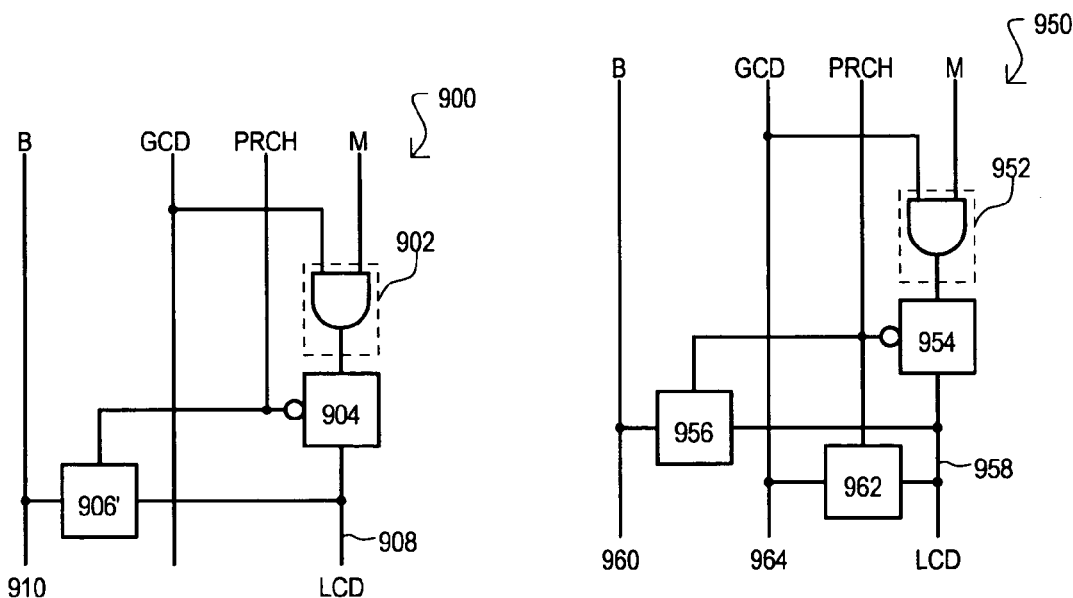
FIGS. 9A and 9B are block schematic diagrams of other driver/equalization circuit that can be included in disclosed embodiments.

Referring now to FIG. 9A, one example of a driver/equalization circuit is shown in a block schematic diagram and designated by the general reference character 900. A driver/equalization circuit could be used as items 868-0 and/or 868-1 of FIG. 8. A driver/equalization circuit 900 can include some of the same features as that shown in FIG. 7, thus like portions are referred to by the same reference character but with the first digit being a "9" instead of a "7".

Unlike the arrangement of FIG. 7, driver/equalization circuit 900 can include a second switch circuit 906' situated between a local compared data line 908 and a bit line 910 (B).

Referring now to FIG. 9B, another example of a driver/equalization circuit is shown in a block schematic diagram and designated by the general reference character 950. A driver/equalization circuit 950 could be used as item 868-0 and/or 868-1 of FIG. 8. A driver/equalization circuit 950 can include some of the same features as that shown in FIG. 9A, including a bit line 960 (B).

Unlike the arrangement of FIG. 9A, driver/equalization circuit 900 can include a third switch circuit 962 situated between a global compare data line 964 and a local compared data line 958.

In this way, local compare data lines can charge share with global compare data lines and/or bit lines.

Figure 10:
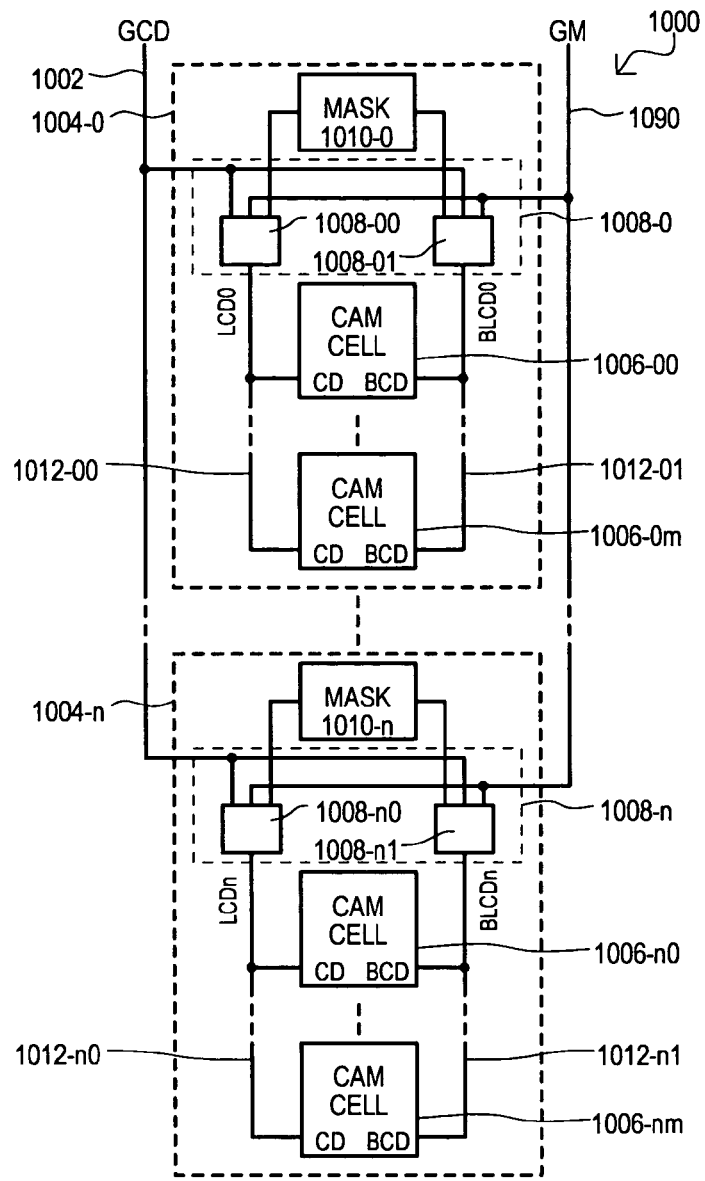
FIG. 10 is a block schematic diagram of a CAM device according to a fifth embodiment.

Referring now to FIG. 10, a CAM device according to a fifth embodiment is shown in block schematic diagram and designated by the general reference character 1000. CAM device 1000 can include some of the same general features as that shown in FIG. 6, thus like portions will be referred to by the same reference character but with the first digit being a "10" instead of a "6".

A CAM device 1000 can differ from that of FIG. 6 in that it can include a single global compare data line 1002 as well as a global mask line 1090. In addition, compare data driver circuits (1008-0 to 1008-n) can include first and second driver circuits (1008-00/01 to 1008-n0/n1) connected to receive a global mask value GM from global mask line 1090.

When a global mask value GM has one value, first and second driver circuits (1008-00/01 to 1008-n0/n1) can generate local compare data values LCD/BLCD in the same fashion as the embodiment of FIG. 2. However, unlike the embodiment of FIG. 2, when a global mask value GM as a second value, first and second driver circuits (1008-00/01 to 1008-n0/n1) can drive local compare data values LCD/BLCD to a same value, thus providing a masking operation for all sections connected to the global mask line 1090.

An arrangement like that of FIG. 10 can provide a masking capability at a higher level than that provided by mask storage circuits (1010-0 to 1010-n). Thus, all CAM cells of all sections (1004-0 to 1004-n) could be masked by a global mask value GM, or CAM cells of only one section could be masked by a "local" mask value in the corresponding mask storage circuit (1010-0 to 1010-n).

In the event CAM cells like that shown in FIG. 3A are utilized in an arrangement like that of FIG. 10, two levels of masking can be provided. At a lower level CAM cells of the same section can be masked according to a "local" mask value (e.g., M0) provided by the corresponding mask value storage circuit (e.g., 1010-0). At a higher level, CAM cells of all sections can be masked according to a global mask value GM.

In the event CAM cells like that shown in FIG. 3B are utilized in an arrangement like that of FIG. 10, three levels of masking can be provided. At a lowest level, individual CAM cells can be masked according to XY data values. At a second level, CAM cells of the same section can be masked according to the local mask value, as described. At a highest level, CAM cells of all sections can be masked according to a global mask value GM.

In this way, a CAM device can provide multi-level pseudo TCAM masking (i.e., masking by column or by sections within a column), or multilevel true TCAM masking (i.e., masking by column, or by sections within a column, or by cells within a section).

Figure 11:
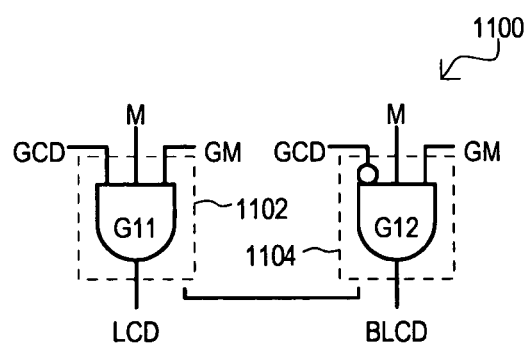
FIG. 11 is a block schematic diagram of another local compare data driver circuit that can be included in disclosed embodiments.

Referring now to FIG. 11, one example of a local compare data driver circuit, like that shown as 1008-0 in FIG. 10, is shown in a schematic diagram and designated by the general reference character 1100. Local compare data driver circuit 1100 can include a first driver circuit 1102 and a second driver circuit 1104. A first driver circuit 1102 can include an AND gate G11 having one input that receives a global compare data value GCD, another input that receives a local mask value M, and another input that receives a global mask value GM. An output of gate G11 can provide a local compare data value LCD. Similarly, second driver circuit 1104 can include an AND gate G12 having an inverting input that receives a global compare data value GCD, another input that receives a local mask value M, and another input that receives a global mask value GM. An output of gate G12 can provide a complementary local compare data value BLCD.

Of course like FIG. 5, FIG. 11 represents but one example of a local compare data driver circuit. Various other logic circuits could be employed according to polarity of received input signals. Further, a local compare data driver could include various output buffers to increase drive strength for local compare data lines.

Figure 12:
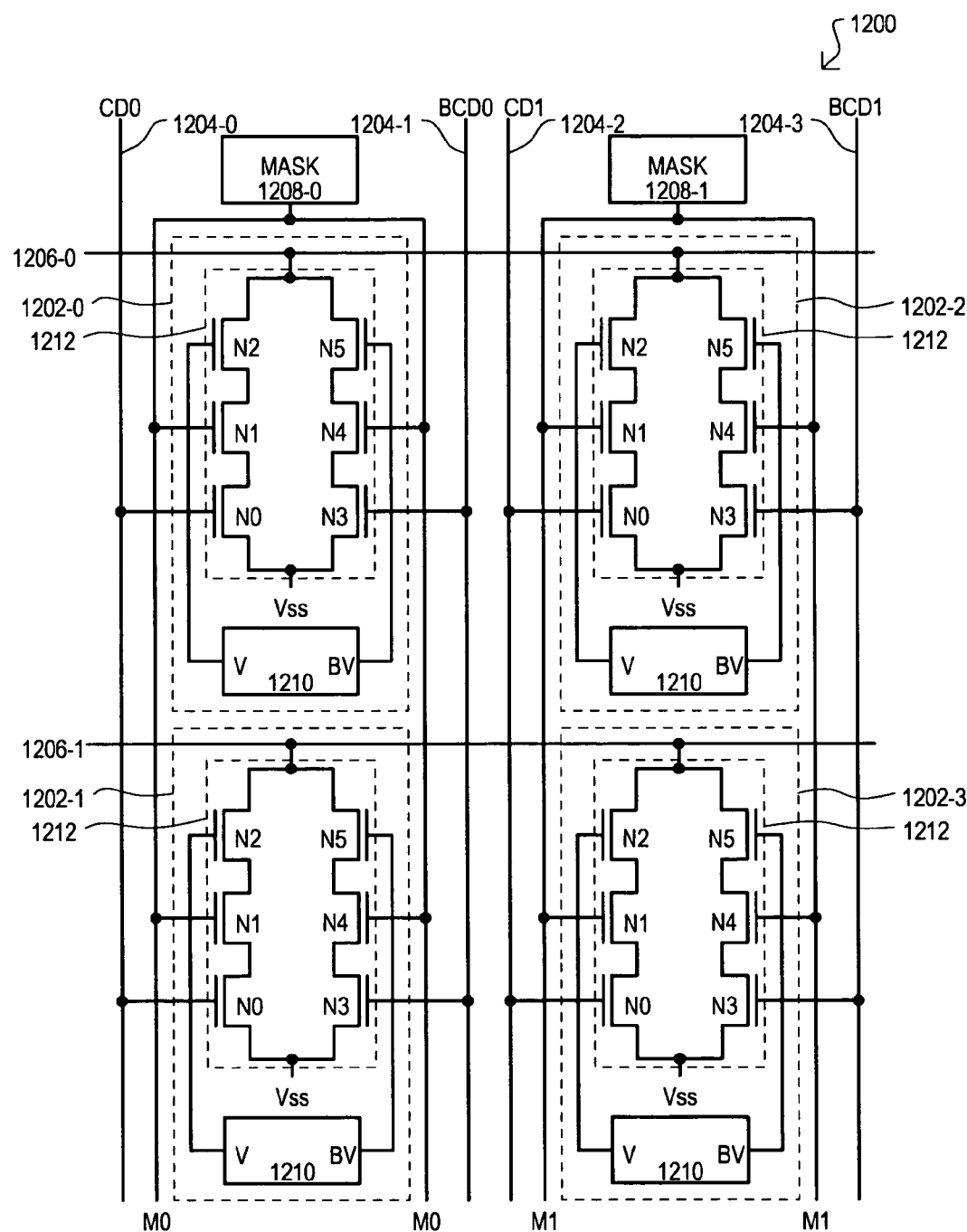
FIG. 12 is a schematic diagram of a conventional pseudo ternary CAM (PTCAM) device.

The various embodiments can provide advantages over a conventional approach like that of FIG. 12. As noted above, compare sections within CAM cells can be just two transistors deep, and as a result, a device can be faster and smaller than such conventional solutions.

In addition, the above approaches can split capacitive loading for compare data signal between global compare data lines and local compare data lines. As a result local compare data lines can be driven in a "repeater" like fashion.

Still further, the above disclosed equalizing embodiments can enable charge sharing for less power consumption.

It is also noted that the above embodiments can provide for easy conversion between pseudo-TCAM configurations and binary or true ternary configurations. Such conversion can be dynamic by programming mask storage circuits to output particular values.

The above embodiments may be incorporated into CAM devices for use in data communications and telecom applications, such as switches, routers, storage devices, and other communications devices for local area networks, wide area networks, metro area networks and wireless networks. In addition, such CAM devices may be used in the routing and transport of multiple types of data such as voice, video, data files, telephone conversations etc.

For purposes of clarity, many of the details of CAM devices and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
   a plurality CAM cell groups, the CAM cells of each group being commonly connected to at least one local compare data line;
   at least a first global compare data line;
   a mask value circuit corresponding to each CAM cell group, each mask value circuit providing a mask value; and
   at least a first logic circuit corresponding to each CAM cell group having a first input coupled to the at least first global compare data line, a second input coupled to receive the mask value of the corresponding mask value circuit, and an output coupled to the corresponding at least first local compare data line.

2. The CAM device of claim 1, wherein:
   each CAM cell comprises a binary CAM cell that includes a compare data input coupled to the local compare data line of the CAM cell group containing the CAM cell,
   a storage circuit, and
   a compare circuit that generates a compare result according to a comparison between a value received at the compare data input and a value stored by the storage circuit.

3. The CAM device of claim 1, wherein:
   each CAM cell comprises
   a storage circuit, and
   at least first and second compare transistors having source-drain paths arranged in series with one another between a match line and a discharge node, the first transistor having a gate coupled to the first local compare data line corresponding to the CAM cell group of the CAM cell, the second transistor having a gate coupled to the storage circuit.

4. The CAM device of claim 1, further including:
   the CAM cells of each group are also commonly connected to a complementary local compare data line;
   a complementary global compare data line; and
   a second logic circuit corresponding to each CAM cell group having a first input coupled to the complementary global compare data line, a second input coupled to receive the mask value of the corresponding local mask value circuit, and an output coupled to the corresponding complementary compare data line.

5. The CAM device of claim 4, wherein:
   each CAM cell comprises
   a storage circuit, and
   first and second compare transistors having source-drain paths arranged in series with one another between a match line and a discharge node, the first transistor having a gate coupled to the local compare data line corresponding to the CAM cell group of the CAM cell, the second transistor having a gate coupled to the storage circuit, and
   third and fourth compare transistors having source-drain paths arranged in series with one another between a match line and the discharge node, the third transistor having a gate coupled to the local complementary compare data line corresponding to the CAM cell group of the CAM cell, the fourth transistor having a gate coupled to the storage circuit.

6. The CAM device of claim 1, wherein:
each mask value circuit comprises a volatile storage circuit.

7. The CAM device of claim 6, wherein:
each mask value circuit comprises a latch.

8. The CAM device of claim 1, wherein:
each mask value circuit comprises a nonvolatile storage circuit.

9. The CAM device of claim 1, wherein:
the at least a first logic circuit comprises an AND gate.

10. A content addressable memory (CAM) device, comprising:
at least a first global compare data line;
a plurality of local compare data line pairs, each local compare data line pair being coupled to the first global compare data line by a corresponding local compare data driver circuit;
a different mask value circuit corresponding to each local compare data line pair;
each local compare data driver circuit drives the corresponding local compare data line pair according to a logical combination of a mask value stored in the corresponding mask value circuit and at least a value on the global compare data line; and
a different group of CAM cells coupled to each local compare data line pair.

11. The CAM device of claim 10, wherein:
each local compare data line pair includes at least a local compare data line; and
each local compare data driver circuit further includes at least a first equalization path coupled between the at least first global compare data line and the local compare data line, the first equalization path providing a low impedance path in response to a precharge signal.

12. The CAM device of claim 11, wherein:
the at least first global compare data line further includes a complementary global compare data line;
each local compare data line pair further includes a complementary local compare data line;
each local compare data driver circuit further includes at least a second equalization path coupled between the complementary global compare data line and the complementary local compare data line, the second equalization path providing a low impedance path in response to the precharge signal.

13. The CAM device of claim 10, further including:
a bit line corresponding to the global compare data line;
each local compare data line pair includes at least a local compare data line; and
each local compare data driver circuit further includes a bit line equalization path coupled between the at least global compare data line and the local compare data line, the bit line equalization path providing a low impedance path in response to a precharge signal.

14. The CAM device of claim 10, wherein:
the groups of CAM cells comprise binary CAM cells, each binary CAM cell providing a compare result according to a comparison between a stored data value and a data value on the corresponding local compare data line pair.

15. The CAM device of claim 14, wherein:
the compare result includes a high or low impedance path between a reference node a match line.

16. The CAM device of claim 10, further including:
a global mask line corresponding to the global compare data line; and
each local compare data driver circuit drives the corresponding local compare line pair according to a logical combination of the mask value stored in the corresponding mask value circuit, the value on the global compare data line, and a value on the global mask line.

17. The CAM device of claim 16, wherein:
each local compare data line pair includes a local compare data line and a complementary local compare data line, and
each local compare data driver circuit includes
a first logic gate having a first input coupled to the global compare data line, a second input coupled to receive the mask value of the corresponding mask value circuit, a third input coupled to the global mask line, and an output coupled to the local compare data line,
the second logic gate having a first input coupled to the global compare data line, a second input coupled to receive the mask value of the corresponding mask value circuit, a third input coupled to the global mask line, and an output coupled to the complementary local compare data line.

18. A method, comprising the steps of:
for each of a plurality of content addressable memory (CAM) cell groups, logically combining a value on at least one global compare data line with a mask value associated with the CAM cell group to generate a local compare data values for the CAM cell group; and
forcing a same match result for all CAM cells of the same CAM cell group when the local compare data values for the CAM cell group have predetermined values.

19. The method of claim 18, wherein:
logically combining the value on at least one global bit line with a mask value associated with each different CAM cell group includes
for each CAM cell group
driving a local compare data line coupled to the CAM cell group according to the logical combination of a value on a global bit line and the associated mask value, and
driving a complementary local compare data line value coupled to the CAM cell group according to the logical combination of a value on a complementary global bit line and the associated mask value.

20. The method of claim 18, wherein:
forcing the same match result for all CAM cells of the same CAM cell group includes, within each CAM cell of the group, creating a high impedance path between a corresponding match line and a discharge node.

* * * * *

UNITED STATES PATENT AND TRADEMARK OFFICE
CERTIFICATE OF CORRECTION

PATENT NO. : 7,417,882 B1 Page 1 of 1
APPLICATION NO. : 11/525274
DATED : August 26, 2008
INVENTOR(S) : Dinesh Maheshwari It is certified that error appears in the above-identified patent and that said Letters Patent is hereby corrected as shown below:

ON THE TITLE PAGE
    At section (73), Assignee, please replace "Netlogics" with -- Netlogic -- so that the corresponding phrase reads – Netlogic Microsystems, Inc. –.

Signed and Sealed this

Eleventh Day of November, 2008

JON W. DUDAS
*Director of the United States Patent and Trademark Office*